United States Patent
Kobayashi et al.

(10) Patent No.: US 7,965,152 B2
(45) Date of Patent: Jun. 21, 2011

(54) ATTENUATOR WITH A CONTROL CIRCUIT

(75) Inventors: Bun Kobayashi, Cypress, CA (US);
Steven W. Schell, Torrance, CA (US);
Pei-Ming Daniel Chow, Los Angeles, CA (US); Mau-Chung Frank Chang, Los Angeles, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 199 days.

(21) Appl. No.: 12/326,791

(22) Filed: Dec. 2, 2008

(65) Prior Publication Data

US 2010/0134218 A1  Jun. 3, 2010

(51) Int. Cl.
*H01P 1/22* (2006.01)
(52) U.S. Cl. ................................ 333/81 R; 327/308
(58) Field of Classification Search .............. 333/81 R, 333/81 A, 17.2; 327/308, 309
See application file for complete search history.

(56) References Cited

U.S. PATENT DOCUMENTS

| | | |
|---|---|---|
| 4,517,535 A | 5/1985 | Pon |
| 5,666,089 A | 9/1997 | Ehlers |
| 6,784,760 B2 | 8/2004 | Olcen et al. |
| 2001/0028282 A1 | 10/2001 | Nishibe |
| 2003/0184461 A1 | 10/2003 | Goyette et al. |
| 2006/0097821 A1 | 5/2006 | Ju et al. |
| 2006/0232357 A1 | 10/2006 | Roldan et al. |
| 2007/0176665 A1 | 8/2007 | Zhang et al. |
| 2007/0268096 A1 | 11/2007 | Yamamoto et al. |

OTHER PUBLICATIONS

M. Miyashita, et al., "Fully Integrated GaAs HBT MMIC Power Amplifier Modules for 2.5/3.5-Ghz-Band WiMAXX Application," IEEE CSIC Symposium, Portland, OR, Digest, Oct. 2007, pp. 219-222.

*Primary Examiner* — Stephen E Jones
(74) *Attorney, Agent, or Firm* — King & Spalding L.L.P.

(57) ABSTRACT

An attenuator system comprises an attenuator and a control circuit for controlling the attenuation of the attenuator. In one embodiment, the attenuator comprises two diodes or two diode connected transistors, and the control circuit comprises two transistors as the only active devices. In another embodiment, the control circuit comprises another transistor in a shut down circuit.

12 Claims, 6 Drawing Sheets

US 7,965,152 B2

ATTENUATOR WITH A CONTROL CIRCUIT

TECHNICAL FIELD

The present invention generally relates to radio frequency (RF) attenuators, and more particularly, to controllable RF attenuators.

BACKGROUND

RF systems may use an attenuator for controlling an input RF signal applied to a power amplifier. Various types of attenuators may be used including T-type attenuators. Some T-type attenuators use field effect transistors (FETS) to shunt the T-arranged resistors. (See e.g., U.S. Pat. No. 5,666,089). These attenuators use a FET process and need control signals having opposite voltages. Other T-type attenuators use diode and capacitor circuits that require more than five transistors to drive the diodes. These attenuators also require a DC supply greater than 3.6 volts for the diodes to turn on.

SUMMARY

An attenuator system comprises an attenuator and a control circuit. The attenuator includes a first input terminal for receiving a radio frequency power signal, includes second and third input terminals for receiving first and second control signals, respectively, and includes a first output terminal for providing a power signal in response to the radio frequency power signal and the first and second control signals. The control circuit includes a fourth input terminal for receiving a control voltage, includes a fifth input terminal for receiving a supply voltage, and includes second and third output terminals for providing the first and second control signals.

In one aspect, the attenuator controls a power level of the power signal in response to the first and second control signals. In another aspect, the attenuator comprises two diodes or two diode connected transistors, and the control circuit comprises two transistors. In yet another aspect, the control circuit comprises another transistor in a shut down circuit.

DETAILED DESCRIPTION

Figure 1:
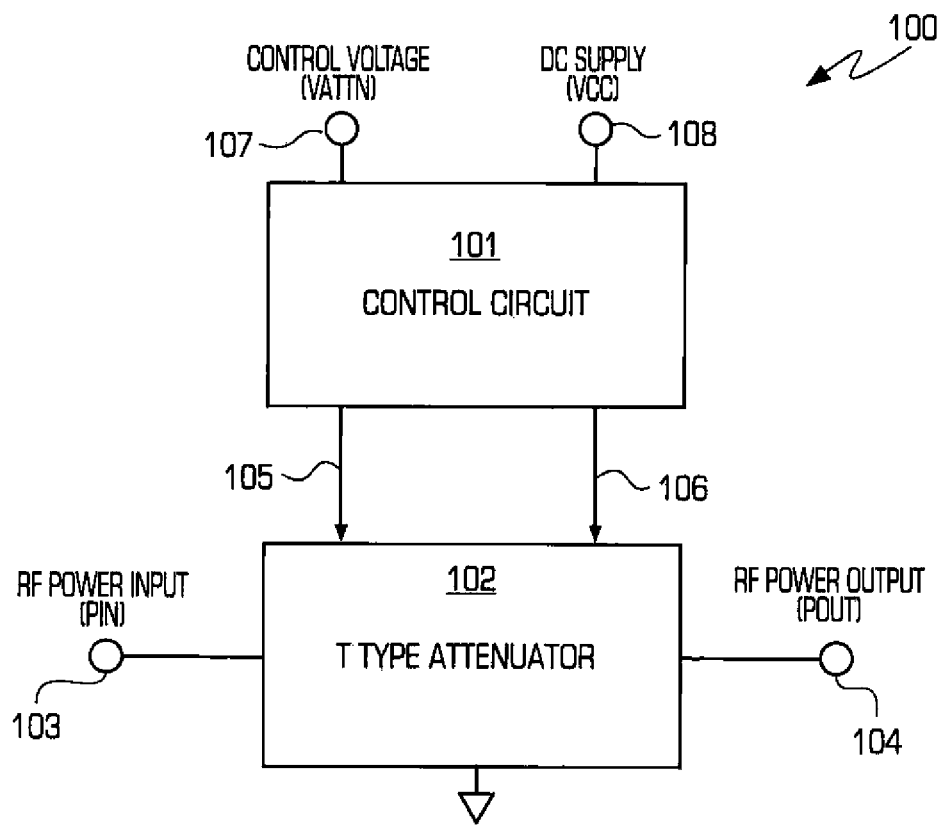
FIG. 1 is a block diagram illustrating an attenuator system.

FIG. 1 is a block diagram illustrating an attenuator system 100. The attenuator system 100 comprises a control circuit 101 and an attenuator 102. The attenuator 102 may be, for example, a T-type attenuator. The attenuator 102 provides an RF power output signal 104 in response to an RF power input signal 103 and control signals 105 and 106. The control circuit 101 provides the control signals 105 and 106 in response to a control voltage 107 and a DC supply voltage (VCC) 108 for adjusting the attenuation of the attenuator 102 to control the power level of the RF power output signal 104. The control signals 105 and 106 control the attenuation of the attenuator 102 in response to the control voltage 107. In one embodiment, the control voltage 107 sets the attenuation of the attenuator 102. In one embodiment, the control voltage 107 is about 1.8 volts for a first attenuation level and about 0.3 volts for a second attenuation level. In one embodiment, the control voltage 107 is received from an external system (not shown) and may be digitally controlled. Although two control signals 105 and 106 are shown, one or more control signals may be used to control the attenuator 102.

In one embodiment, the attenuator system 100 may be used in a power amplifier for a wireless communications system, such as WiMax (worldwide interoperability for microwave and access) or an IEEE 802.16e Standard system. In an IEEE 802.16e Standard system, the attenuator of the attenuator system 100 is controllable in 20 dB steps.

Figure 2:
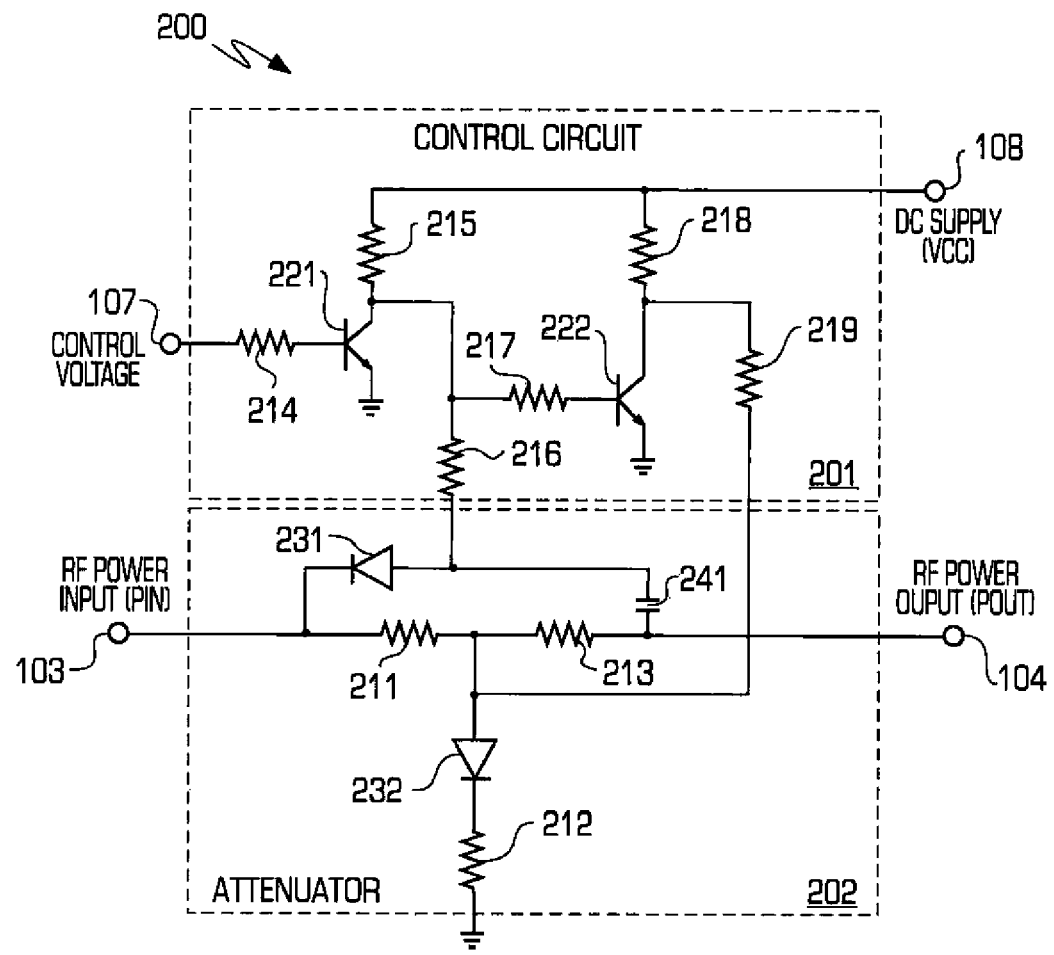
FIG. 2 is a schematic diagram illustrating a first embodiment of the attenuator system of FIG. 1.

FIG. 2 is a schematic diagram illustrating an attenuator system 200, which may be one embodiment of the attenuator system 100 (FIG. 1). The control circuit 201 comprises a plurality of resistors 214, 215, 216, 217, 218, and 219 and a plurality of transistors 221 and 222. In one embodiment, the bipolar transistors 221 and 222 are heterojunction bipolar transistors (HBTs). The control voltage 107 controls the bias of the transistor 221, which in turn controls the bias of the transistor 222 for controlling the currents through the resistors 216 and 219. These currents corresponds to the control signals 105 and 106 (FIG. 1). The attenuator 202 comprises a plurality of resistors 211, 212 and 213, a plurality of diodes 231 and 232, and a capacitor 241. The resistor 216 provides the control signal 105 (FIG. 1) to the anode of the diode 231 and the capacitor 241. The resistor 219 provides the control signal 106 (FIG. 1) to the anode of the diode 232 and a common node formed between the resistors 211 and 213.

The operation of the attenuator system 200 is next described. Setting the control voltage 107 to a low state (e.g., 0.7 volts) sets the attenuator 202 to a pass-through state. In this state, the transistor 221 is off. The collector of the transistor 221 is pulled up by the supply voltage 108, and thereby turns on the transistor 222. The collector of the transistor 222 is a low level of around 0.2 volts. Further, the diode 231 is turned on, and the diode 232 is turned off. The DC current flows from the DC supply 108 through the resistors 215 and 216, the diode 231, the resistors 211 and 219, and the transistor 222 to ground. The turned-on diode 231 has lower impedance to RF power than that of the turned-off diode 232 and than resistors 211 and 213. Therefore, RF power flowing into the attenuator 202 from the RF power input signal 103 passes through the diode 231 and the capacitor 241 and the RF power flows out of the attenuator 202 with very low attenuation on the RF power output 104.

Setting the control voltage 107 to a high state (e.g., 1.8 volts) sets the attenuator 202 to an attenuation state. In this state, the transistor 221 is on. The collector of the transistor 221 is pulled down to ground, and thereby turns off the transistor 222. Further, the diode 231 is turned off, and the diode 232 is turned on. Therefore, DC current flows from the DC supply 108 through the resistors 218 and 219, the diode 232, and the resistor 212 to ground. Because the diode 232 is on, RF power flowing into the attenuator 202 from the RF power input signal 103 is divided so that some RF power flows through the diode 232 reducing the RF power that flows out of the attenuator 202 on the RF power output 104.

In an illustrative embodiment, the capacitor 241 has a capacitance of 5-8 picofarads. The resistors 211 and 213 each have a resistance of 60 ohms. The resistor 212 has a resistance of 0-1 ohms depending on the characteristics of the diode 232. The resistors 214, 215 and 216 have resistances of 4000, 1000 and 800 respectively. The resistors 217, 218, and 219 have resistances of 3000, 2000, and 200 ohms, respectively. In this illustrative embodiment, the diodes 231 and 232 turn on with a voltage over 1.2 volts for Gallium Arsenide diodes. The supply voltage 108 is about 3.3 volts.

Figure 3:
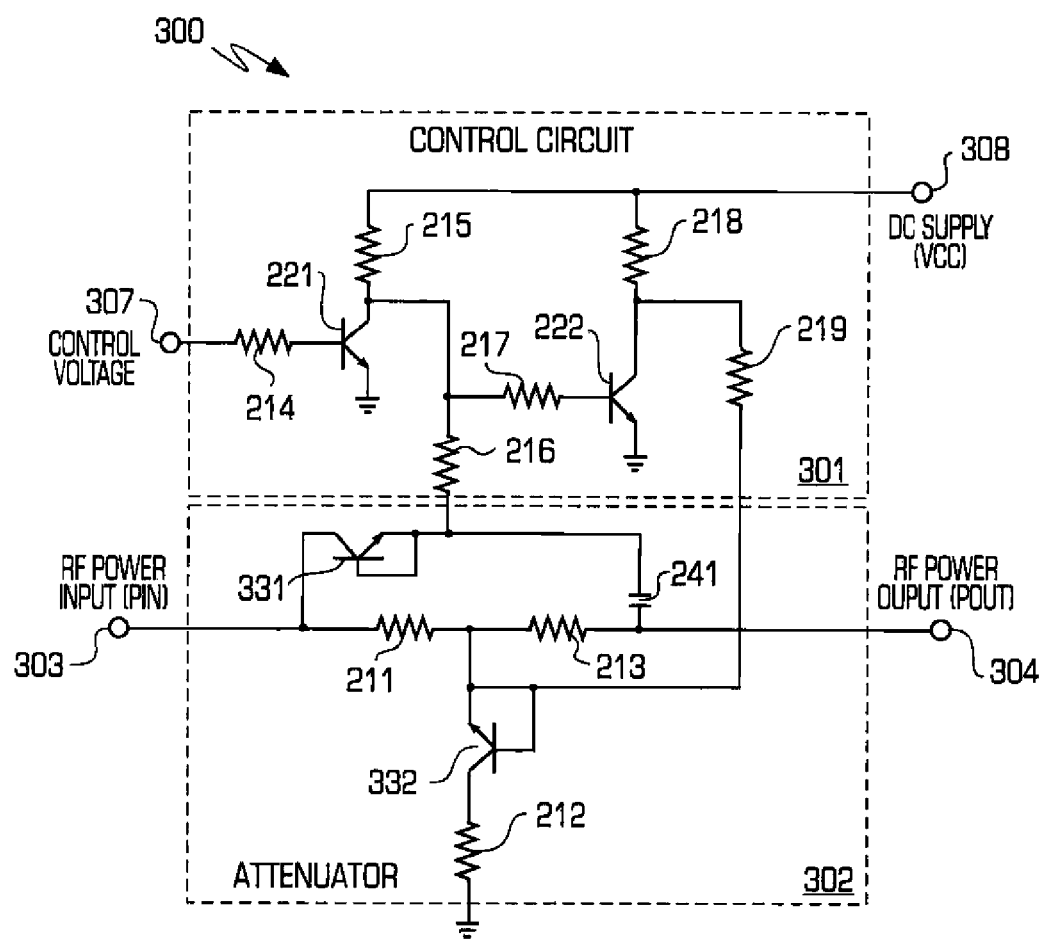
FIG. 3 is a schematic diagram illustrating a second embodiment of the attenuator system of FIG. 1.

FIG. 3 is a schematic diagram illustrating an attenuator system 300, which may be one embodiment of the attenuator system 100 (FIG. 1). The attenuator system 300 is similar to the attenuator 200 (FIG. 2), but includes a heterojunction bipolar transistor 331 instead of the diode 231, and also includes a heterojunction bipolar transistor 332 instead of the diode 232. The transistors 331 and 332 are diode connected. In one embodiment, the collector junctions of the transistors 331 and 332 are used as diodes because the breakdown voltage of the collector is higher than that of the emitter of a heterojunction bipolar transistor. In one embodiment, the transistors 221, 222, 331, and 332 are formed by the same semiconductor processes.

Figure 4:
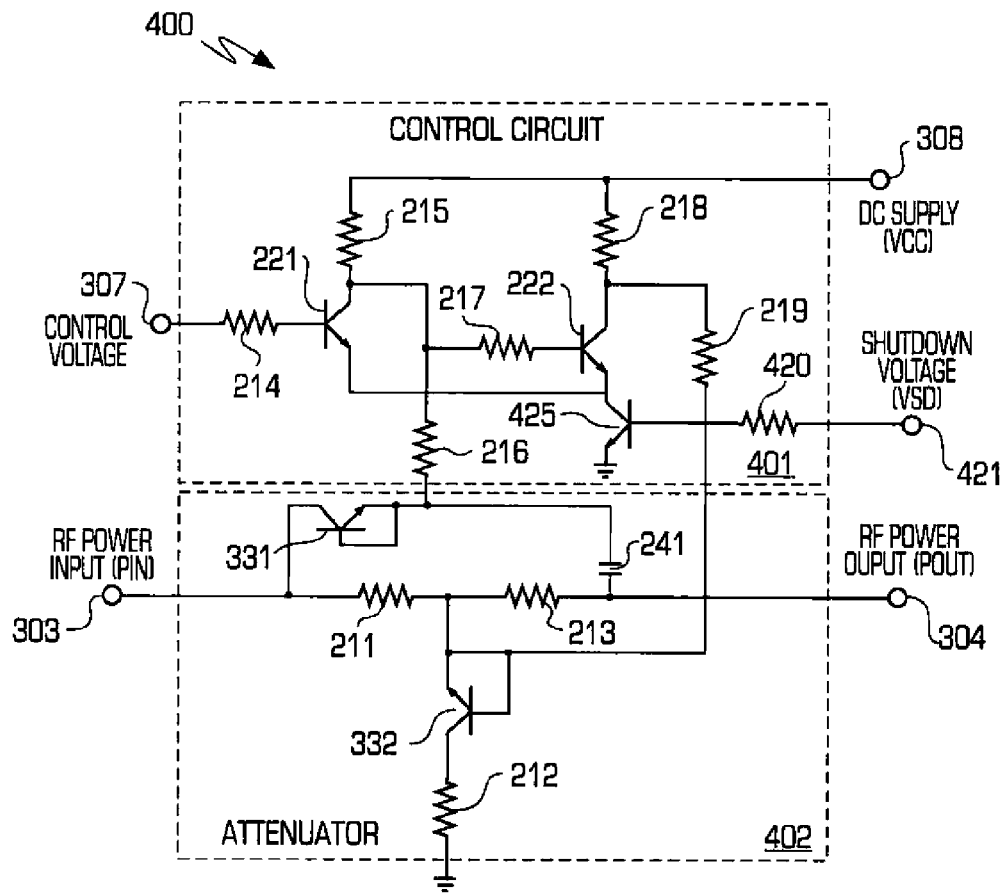
FIG. 4 is a schematic diagram illustrating a third embodiment of the attenuator system of FIG. 1.

FIG. 4 is a schematic diagram illustrating an attenuator system 400, which may be one embodiment of the attenuator system 100 (FIG. 1). The attenuator system 400 includes a shut-down circuit.

The attenuator system 400 is similar to the attenuator system 300 (FIG. 3), but further includes a shut-down circuit comprising a transistor 425 and a resistor 420. In response to a shutdown voltage 421, the transistor 425 pulls down the emitters of the transistors 221 and 222 to ground. The shut-down voltage 421 may be provided by a power amplifier (such as the amplifier in FIGS. 5 and 6), and may be a bias voltage therefrom.

The operation of the attenuator system 400 is next described. If the shut-down voltage 421 is greater than a predetermined threshold (e.g., 2 volts), the transistor 425 is on (the Vce of the transistor 425 may be for example 0.2 volts), regardless of whether either the transistor 221 or the transistor 222 is on. If the shut-down voltage 421 is low (e.g., 0.3 volts), the transistors 221, 222 and 425 are off. Furthermore, the diode connected transistor 331 is off, and the diode connected transistor 332 is on.

Figure 5:
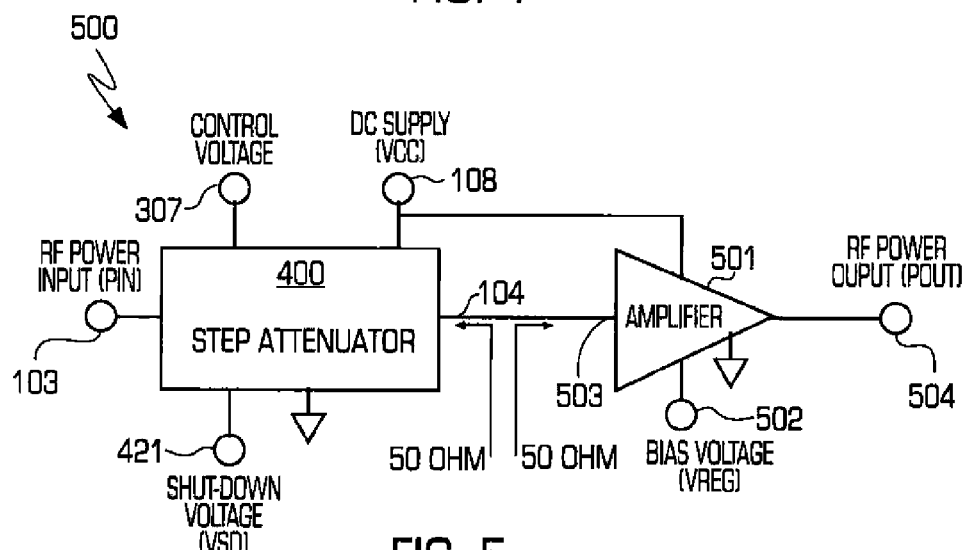
FIG. 5 is a schematic diagram illustrating an amplifier system including the attenuator system of FIG. 4.

FIG. 5 is a schematic diagram illustrating an amplifier system 500 that includes a power amplifier. The amplifier system 500 comprises a step attenuator system 400 and a power amplifier 501. The amplifier 501 includes an input terminal 503 coupled to the output terminal 104 of the step attenuator 400 and an output terminal 504 for providing an RF power output signal in response to a signal applied to the input terminal 503. In one embodiment, the output impedance of the step attenuator 400 and the input impedance of the amplifier 501 are matched. In one embodiment, the step attenuator 400 has an output impedance of 50 ohms, and the amplifier 501 has an input impedance of 50 ohms. In alternative embodiments, the step attenuator system 400 maybe the attenuator systems 100 (FIG. 1), 200 (FIG. 2), or 300 (FIG. 3).

Figure 6:
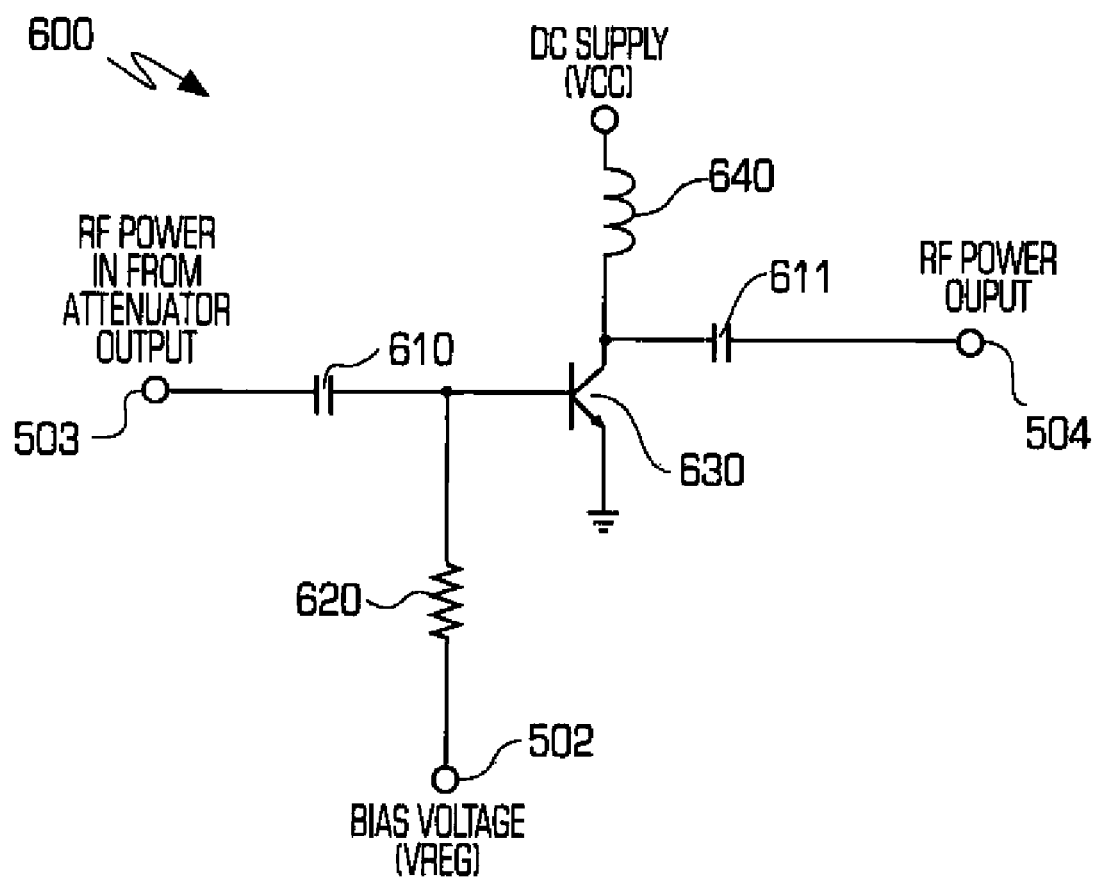
FIG. 6 is a schematic diagram illustrating a power amplifier of the amplifier system of FIG. 5.

FIG. 6 is a schematic diagram illustrating a power amplifier 600, which is one embodiment of the power amplifier 501. The amplifier 600 comprises a plurality of capacitors 610 and 611, a resistor 620, an inductor 630, and a transistor 640. The capacitor 610 functions as a DC block and couples the input terminal 503 to the base of the transistor 630. The resistor 620 couples the bias voltage terminal 502 to the base of the transistor 630. The inductor 640 couples the DC supply voltage 109 to the collector of the transistor 630. The capacitor 611 couples the collector of the transistor 630 to the RF power output terminal 504.

Figure 7:
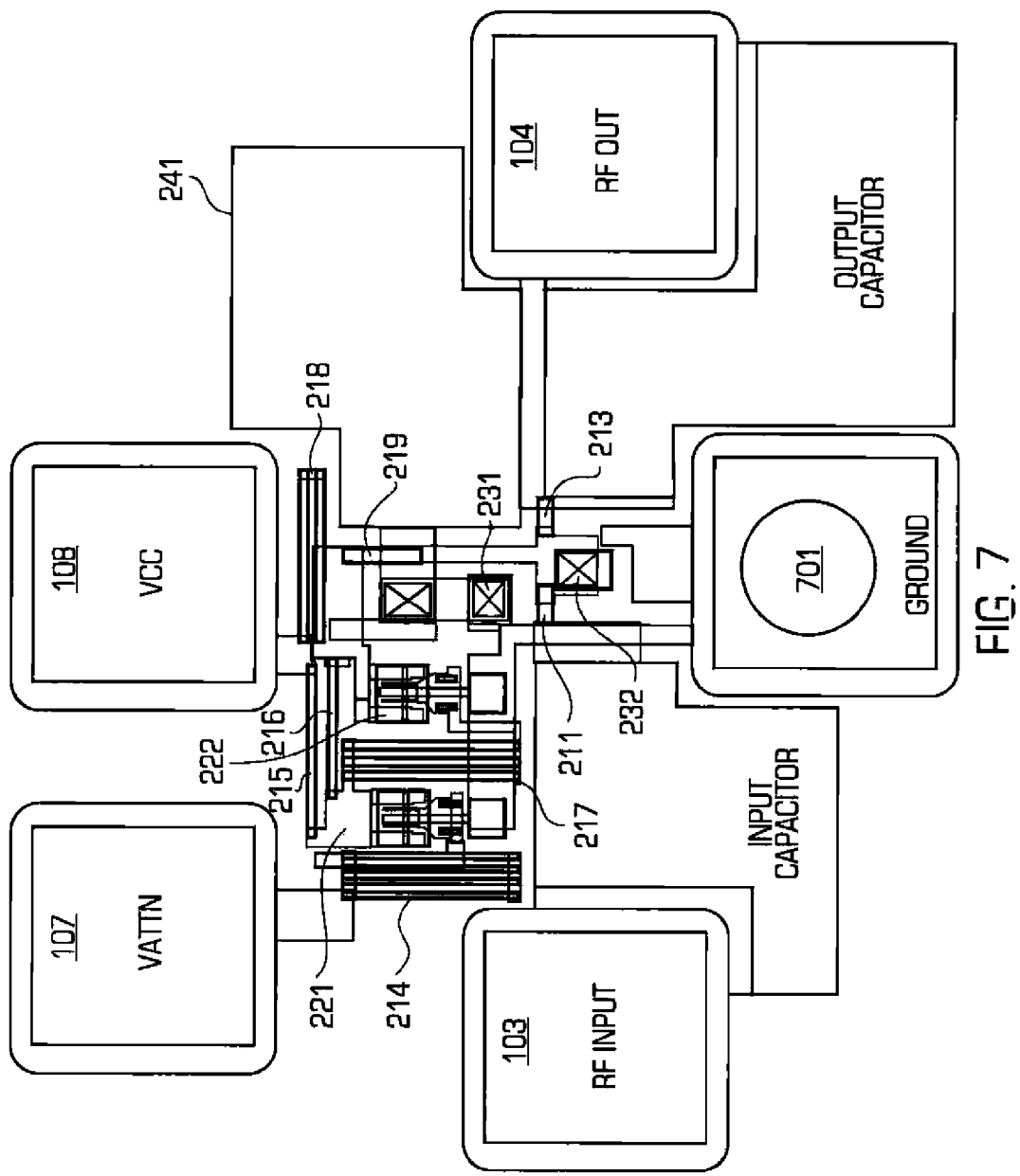
FIG. 7 is a top plan view illustrating one embodiment of an integrated circuit layout of a control circuit of the attenuator system of FIG. 3.

FIG. 7 is a top plan view illustrating one embodiment of an integrated circuit layout of the attenuator system 200 (FIG. 2) except adding an input capacitor between the RF power input terminal 103 and the resistor 211 and adding a output capacitor between the resistor 213 and the RF power output 104 as DC blocks for measurement. In addition, the resistor 212 is omitted. All of the terminals of the RF input 103, control voltage 107, DC supply 108 ant RF power output 104 are laid out as bonding pads of 100×100 square microns. A via 701 of 50 microns in diameter is disposed through top metal layers to a back side (not shown) of the circuit chip. The capacitors have a capacitance density of around 560 picofarads/square millimeter. The resistors have a sheet resistance of around 50 ohm/square. The transistors 221 and 217 have an emitter area of around 42 square microns. The diodes are formed by the junctions of collectors of the HBT.

Although the attenuator systems herein have been described using HBT, other type s of transistors may be used. For example, Si (Silicon) or Si Ge (Silicon Germanium) bipolar junction transistors (either npn or pnp) may be used to form the transistors and diodes.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. An attenuator system comprising:
   an attenuator including a first input terminal for receiving a radio frequency power signal, including second and third input terminals for receiving first and second control signals, respectively, wherein said attenuator being controlled by only said first and second control signals, and including a first output terminal for providing a power signal in response to the radio frequency power signal and the first and second control signals; and
   a control circuit including a fourth input terminal for receiving a control voltage, including a fifth input terminal for receiving a supply voltage, and including second and third output terminals for providing the first and second control signals.

2. The attenuator system of claim 1 wherein the attenuator controls a power level of the power signal in response to the first and second control signals.

3. The attenuator system of claim 1 wherein the attenuator comprises two diodes and the control circuit comprises two transistors.

4. The attenuator system of claim 1 wherein the control circuit comprises:
   a first resistor including a first terminal coupled to the fourth input terminal of the control circuit and including a second terminal;
   a first transistor including a base coupled to the second terminal of the first resistor, including an emitter coupled to a ground node, and including a collector;
   a second resistor including a first terminal coupled to the fifth input terminal of the control circuit and including a second terminal coupled to the collector of the first transistor;
   a third resistor including a first terminal coupled to the collector of the first transistor and including a second terminal coupled to the second output terminal of the control circuit;
   a fourth resistor including a first terminal coupled to the collector of the first transistor and including a second terminal;

a second transistor including a base coupled to the second terminal of the fourth resistor, including an emitter coupled to the ground node, and including a collector;

a fifth resistor including a first terminal coupled to the collector of the second transistor and including a second terminal coupled to the fifth input terminal of the control circuit; and a sixth resistor including a first terminal coupled to the collector of the second transistor and including a second terminal coupled to the third output terminal of the control circuit.

5. The attenuator system of claim 4 wherein the first and second transistors comprise a heterojunction bipolar transistor.

6. The attenuator system of claim 4 wherein the attenuator comprises:

a seventh resistor including a first terminal coupled to the first input terminal and including a second terminal;

an eighth resistor including a first terminal coupled to the second terminal of the seventh resistor and including a second terminal coupled to the first output terminal;

a first diode including an cathode coupled to the first terminal of the seventh resistor and including an anode coupled to the second input terminal;

a capacitor including a first terminal coupled to the anode of the first diode and including a second terminal coupled to the second terminal of the eighth resistor;

a second diode including an anode coupled to the second terminal of the seventh resistor and including a cathode; and a ninth resistor including a first terminal coupled to the cathode of the second diode and including a second terminal coupled to the ground node.

7. The attenuator system of claim 4 wherein the attenuator comprises:

a seventh resistor including a first terminal coupled to the first input terminal and including a second terminal;

an eighth resistor including a first terminal coupled to the second terminal of the seventh resistor and including a second terminal coupled to the first output terminal;

a first transistor including a collector coupled to the first terminal of the seventh resistor, including a base, and including an emitter coupled to said base and to the second input terminal of the control circuit;

a capacitor including a first terminal coupled to the emitter of the first transistor and including a second terminal coupled to the second terminal of the eighth resistor;

a second transistor including a base, including an emitter coupled to said base and to the second terminal of the seventh resistor; and a ninth resistor including a first terminal coupled to the collector of the second transistor and including a second terminal coupled to the ground node.

8. The attenuator system of claim 7 wherein the first and second transistors comprise a heterojunction bipolar transistor.

9. The attenuator system of claim 1 wherein the control circuit comprises a shutdown voltage terminal and further comprises:

a first resistor including the first terminal coupled to the first terminal control circuit and including a second terminal;

a first transistor including a base coupled to the second terminal of the first resistor, including an emitter, and including a collector;

a second resistor including a first terminal coupled to the second terminal of the control circuit and including a second terminal coupled to the collector of the first transistor;

a third resistor including a first terminal coupled to the collector of the first transistor and including a second terminal coupled to the second output terminal of the control circuit;

a fourth resistor including a first terminal coupled to the collector of the first transistor and including a second terminal;

a second transistor including a base coupled to the second terminal of the fourth resistor, including an emitter, and including a collector;

a fifth resistor including a first terminal coupled to the collector of the second transistor and including a second terminal coupled to the fifth input terminal of the control circuit;

a sixth resistor including a first terminal coupled to the collector of the second transistor and including a second terminal coupled to the third output terminal of the control circuit;

a third transistor including a collector coupled to the emitters of the first and second transistors, including a base, and including an emitter coupled to a ground node; and a seventh resistor including a first terminal coupled to the base of the third transistor and including a second terminal coupled to the shutdown voltage terminal.

10. The attenuator system of claim 9 wherein the first, second and third transistors comprise a heterojunction bipolar transistor.

11. The attenuator system of claim 1 further comprising an amplifier including an input terminal coupled to the first output terminal of the attenuator and including an output terminal for providing an output RF signal.

12. The attenuator system of claim 11, wherein the amplifier comprising:

a first capacitor including a first terminal coupled to the input terminal of the amplifier and including a second terminal;

a first resistor including a first terminal coupled to the first terminal of the first capacitor and including a second terminal coupled to a bias voltage terminal;

a first transistor including a base coupled to the second terminal of the first capacitor, including an emitter coupled to a ground node, and including a collector;

a first inductor including a first terminal coupled to the collector of the first transistor and including a second terminal coupled to a DC supply terminal; and a second capacitor including a first terminal coupled to the collector of the first transistor and including a second terminal coupled to the output terminal of the amplifier.

* * * * *